(12) United States Patent
Huh

(10) Patent No.: US 11,337,296 B2
(45) Date of Patent: May 17, 2022

(54) SYSTEMS AND METHODS FOR CONTINUOUSLY SUPPLYING NEGATIVE IONS USING MULTI-PULSED PLASMA SOURCES

(71) Applicant: KOREA ATOMIC ENERGY RESEARCH INSTITUTE, Daejeon (KR)

(72) Inventor: Sungryul Huh, Sejong-si (KR)

(73) Assignee: KOREA ATOMIC ENERGY RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/764,658

(22) PCT Filed: Oct. 24, 2018

(86) PCT No.: PCT/KR2018/012642
§ 371 (c)(1),
(2) Date: May 15, 2020

(87) PCT Pub. No.: WO2019/098554
PCT Pub. Date: May 23, 2019

(65) Prior Publication Data
US 2020/0288561 A1    Sep. 10, 2020

(30) Foreign Application Priority Data
Nov. 17, 2017  (KR) .......... 10-2017-0154107

(51) Int. Cl.
*H05H 1/46*  (2006.01)
*H01J 27/02*  (2006.01)
*H01J 37/32*  (2006.01)

(52) U.S. Cl.
CPC ............ *H05H 1/46* (2013.01); *H01J 27/024* (2013.01); *H01J 27/028* (2013.01);
(Continued)

(58) Field of Classification Search
None
See application file for complete search history.

(56) References Cited

U.S. PATENT DOCUMENTS 4,851,668 A * 7/1989 Ohno ............ H01J 27/16
250/251
5,558,718 A * 9/1996 Leung ............ C23C 8/36
118/723 E
(Continued)

FOREIGN PATENT DOCUMENTS

JP  2001-289982 A  10/2001
KR  1998-025047 A   7/1998
(Continued)

OTHER PUBLICATIONS

International Search Report issued in corresponding International Patent Application No. PCT/KR2018/012642 dated Feb. 18, 2019, along with an English translation.
(Continued)

*Primary Examiner* — Srinivas Sathiraju
(74) *Attorney, Agent, or Firm* — Hauptman Ham, LLP

(57) ABSTRACT

The present disclosure relates to a system and method for continuously supplying negative ions using multi-pulsed plasma sources. The system includes a plurality of plasma generators each to generate plasma by applying pulsed power to the electronegative gas from a gas source; a negative ion supply unit connected to the plasma generators to receive the plasmas transferred therefrom and to continuously supply ions; and a controller connected to the plurality of plasma generators and configured to control characteristics of the pulsed powers delivered to the respective plasma generators and to adjust phase shift associated with the pulsed power envelopes. By adjusting the phase shift, the controller enables a plasma in one of the plasma generators
(Continued)

to be in an after-glow state when a plasma in another plasma generator is in an active-glow state.

17 Claims, 8 Drawing Sheets

(52) U.S. Cl.
CPC .... *H01J 37/32036* (2013.01); *H01J 37/3244* (2013.01); *H01J 37/32146* (2013.01); *H01J 2237/057* (2013.01); *H05H 2242/20* (2021.05)

(56) References Cited

U.S. PATENT DOCUMENTS

| | | | | |
|---|---|---|---|---|
| 5,935,373 | A * | 8/1999 | Koshimizu | H01J 37/321 |
| | | | | 156/345.28 |
| 7,045,793 | B2 * | 5/2006 | Wahlin | H01J 27/024 |
| | | | | 250/396 R |
| 8,927,942 | B2 * | 1/2015 | Gierak | H01J 27/022 |
| | | | | 250/423 R |
| 9,336,979 | B2 * | 5/2016 | Yasaka | H01J 27/26 |
| 9,530,615 | B2 * | 12/2016 | Kurunczi | B08B 7/0021 |
| 9,655,223 | B2 * | 5/2017 | Smith | H01J 27/16 |
| 9,847,205 | B2 * | 12/2017 | Sherman | H01J 27/18 |
| 9,941,102 | B2 * | 4/2018 | Kouznetsov | C23C 14/351 |
| 9,997,261 | B2 * | 6/2018 | Tuszewski | G21B 1/052 |
| 10,049,774 | B2 * | 8/2018 | Tuszewski | G21B 1/15 |
| 10,297,412 | B2 * | 5/2019 | Sherman | H05H 1/30 |
| 10,743,398 | B2 * | 8/2020 | Binderbauer | G21B 1/052 |
| 10,790,064 | B2 * | 9/2020 | Tuszewski | H05H 1/14 |
| 10,811,159 | B2 * | 10/2020 | Cohen | G21B 1/15 |
| 10,854,448 | B2 * | 12/2020 | Takahashi | H01J 37/3408 |
| 10,950,409 | B2 * | 3/2021 | Sherman | H01J 27/024 |
| 2008/0296143 | A1 * | 12/2008 | Ellul | H01J 37/32623 |
| | | | | 204/156 |
| 2012/0304618 | A1 | 12/2012 | Roy | |
| 2013/0084474 | A1 * | 4/2013 | Mills | H01M 10/399 |
| | | | | 429/9 |
| 2013/0161505 | A1 * | 6/2013 | Pitcher | H01J 49/06 |
| | | | | 250/281 |
| 2013/0207000 | A1 * | 8/2013 | Gunther | H01J 27/024 |
| | | | | 250/396 R |
| 2014/0263998 | A1 * | 9/2014 | Perkins | H01J 27/205 |
| | | | | 250/269.6 |
| 2014/0265858 | A1 * | 9/2014 | Perkins | H01J 27/024 |
| | | | | 315/111.91 |
| 2014/0375209 | A1 * | 12/2014 | Russ | H01J 49/147 |
| | | | | 315/111.91 |
| 2015/0325413 | A1 * | 11/2015 | Kim | H01J 37/32449 |
| | | | | 315/111.21 |
| 2016/0163495 | A1 * | 6/2016 | Sherman | H05H 3/00 |
| | | | | 315/111.81 |
| 2017/0018410 | A1 * | 1/2017 | Laux | H01J 37/32568 |
| 2017/0032937 | A1 * | 2/2017 | Distaso | H01J 37/08 |
| 2018/0122615 | A1 * | 5/2018 | Sherman | H05H 1/46 |
| 2019/0051491 | A1 * | 2/2019 | Matsubara | H01J 37/285 |
| 2019/0242838 | A1 * | 8/2019 | Gillman | G01R 27/28 |
| 2019/0279835 | A1 * | 9/2019 | Sherman | H01J 37/08 |
| 2020/0288561 | A1 * | 9/2020 | Huh | H05H 1/46 |
| 2020/0294750 | A1 * | 9/2020 | Radovanov | H01J 27/08 |

FOREIGN PATENT DOCUMENTS

| | | |
|---|---|---|
| KR | 10-2010-0129368 A | 12/2010 |
| KR | 10-2014-0068055 A | 6/2014 |
| KR | 10-2016-0054463 A | 5/2016 |
| KR | 10-2017-0117268 A | 10/2017 |
| WO | WO-2014201292 A1 * 12/2014 | ............ H01J 27/024 |

OTHER PUBLICATIONS

Written Opinion issued in corresponding International Patent Application No. PCT/KR2018/012642 dated Feb. 18, 2019.
Japanese Office Action for corresponding Japanese Patent Application No. 2020-527050 dated Jul. 2, 2021.
Extended European search report for corresponding European Patent Application No. 18878390.6 dated Jul. 19, 2021.
Ane Aanesland et al., "Electric propulsion using ion-ion plasmas," Journal of Physics: Conference Series, Apr. 1, 2009, p. 12009, vol. 162, No. 1, XP020157447, Institute of Physics Publishing, Bristol, GB.
L.J. Overzei et al., "Enhancement of the negative ion flux to surfaces from radio-frequency processing discharges," Journal of Applied Physics, Aug. 15, 1989, pp. 1622-1631, vol. 66, No. 4, XP055821233.
Weixing Ding et al., "Enhanced formation of negative ions by electron attachment to highly excited molecules in a flowing afterglow plasma," Journal of Applied Physics, Sep. 15, 1998, pp. 3051-3058, vol. 84, No. 6, XP012045851.

* cited by examiner

SYSTEMS AND METHODS FOR CONTINUOUSLY SUPPLYING NEGATIVE IONS USING MULTI-PULSED PLASMA SOURCES

CROSS-REFERENCE TO RELATED APPLICATION

This application is the National Stage filing under 35 U.S.C. 371 of International Application No. PCT/KR2018/012642, filed on Oct. 24, 2018, which claims the benefit of earlier filing date and right of priority to Korean Application No. 10-2017-0154107, filed on Nov. 17, 2017, the contents of which are all hereby incorporated by reference herein in their entireties.

FIELD

The present disclosure relates to a system and method for supplying negative ions by controlling multi-pulsed plasma sources.

BACKGROUND

Plasmas are often called the fourth state of matter after solids, liquids and gases.

Plasma is defined as a 'tank' of partially ionized quasi-neutral gases that contain neutral and charged particles such as radicals, atoms, molecules, neutral particles, electrons, and ions. Here, electrons in plasmas are distributed for energy levels, and may be classified into two groups; high-energy electrons and low-energy electrons.

On the other hand, negative ion (source) technologies are widely used in various application fields including semiconductor, space propulsion, and fusion fields. The related art negative ion (source) technologies utilized in each of those fields and a newly required negative ion (source) technology will be described in detail below.

For fusion applications, in order to achieve a high-performance fusion plasma operation, devices for heating and current drive of a reactor are necessary.

A Neutral Beam Injector (NBI) is the most powerful source of heating and current drive in the fusion reactor. Specifically, neutral beams from the NBI inject into a plasma regardless of magnetic confinement fields and then transfer their energy and momentum to the plasma, resulting in the heating and current drive. These neutral beams can be produced by the neutralization of accelerated charged particles (e.g., positive or negative deuterium ions) via collisions with gas molecules in an NBI neutralizer. Ion sources for the NBIs play a role in generating the ions that will be accelerated in a beam extraction system and then neutralized in the neutralizer mentioned above.

On the other hand, according to previous studies, neutralization efficiencies of positive and negative ion beams during the neutralization are different and also changed with the beam energy. The neutralization efficiency of negative ion beam is much higher than that of the positive ion beam in the high energy regime.

Therefore, it is mandatory for the high-performance fusion plasma operation with the high-energy NBI to develop an ion source technology for stably supplying and controlling negative ions.

For semiconductor industry, on the other hand, continued shrinking of chip device feature size requires etching technologies with the ability to control tighter critical dimension (CD) at the nanometer (nm) scale. As the CD has decreased, ion-induced (mainly positive-ion-induced) damages (e.g., charging damage) and abnormal etching in the process have become more severe.

In order to tackle these challenging problems, it is necessary to develop a technology for supplying and controlling negative ions, capable of contributing to surface charge neutralization for mitigating the damages.

For space propulsion applications, on the other hand, an ion thruster, which is a form of electric propulsion used for spacecraft propulsion, creates thrust by using beams of positive ions from a plasma ion source. In the ion thruster, an electron emitter called the neutralizer is used to prevent the spacecraft from gaining a net negative charge by expelling the positive ions. If the spacecraft is negatively charged, ions can come back toward the spacecraft and then cancel the thrust. However, even though the neutralizer is essential, this system has disadvantages in that the neutralizer takes up space and adds the weight of the spacecraft.

Therefore, in order to remedy the disadvantages, a neutralizer-free thruster using a steady-state ion-ion plasma has recently been studied. In detail, the thruster generates a plasma composed of positive and negative ions and accelerates them alternatively with grids with AC voltages. This leads to generation of thrust and space-charge neutralization. There still remains a technological challenge which is to make plenty of negative ions continuously, maintaining very low electron density.

As described above, in order to solve the problems in the aforementioned various fields, there is a need of a technology for continuously supplying negative ions at high densities and controlling them. Hereinafter, the related art for supplying and controlling negative ions will be described in detail and related problems will be described.

In general, a device that generates and supplies negative ions is referred to as a plasma negative ion source. Specifically, the plasma negative ion source produces plasmas including negative ions by the discharge in gases containing electronegative gas and extracts the generated negative ions for use. Here, the electronegative gas refers to feedstock gas or gas capable of producing negative ions in a plasma discharge.

Negative ions can be formed by processes occurring in a plasma discharge volume and on surfaces facing the discharge. Negative ion production mechanisms in the plasma negative ion source may be divided into two types; a surface production mechanism and a volume production mechanism.

The surface production is a reaction principle that negative ions are produced as electronegative gas atoms (or positive ions) receive electrons from a surface of an ion source device, on which a material (e.g., Cecium (Cs)) with a low work function is coated. Here, the work function refers to the minimum work or energy required to remove an electron from the material.

The surface production mechanism is a reaction principle that an electronegative gas atom (or a positive ion) captures an electron (or electrons) from a metal to an affinity level and escapes from the surface as a negative ion. Cesium (Cs) is a typical alkali metal and thus Cs-coated surface can enhance negative ion production efficiency due to a low work function. Here, the work function refers to the minimum work or energy required to remove an electron from the material.

However, although the negative ion source based on the surface production mechanism has much higher negative ion production efficiency compared to that based on the volume production mechanism to be described below, there are several drawbacks inherently regarding the usage of Cs.

First, Cs control is difficult due to the complex chemistry and adsorption and desorption dynamics of Cs. Second, Cs can react with impurities, resulting in deterioration of the work function. Lastly, Cs can move into the accelerator stages and lower their voltage holding capabilities.

These cause serious management issues, and also require inconvenient counteracting processes like continuous evaporation of fresh Cs and conditioning of the ion source for a reliable, long-term operation.

The above problems motivate the search for alternatives. In recent years, various concepts to exclude or minimize the usage of Cs have been researched for the development of a high-performance negative ion source. A method for generating and supplying negative ions based on the volume production mechanism to be mentioned later is one of them.

The volume production mechanism includes a two-step process: (1) generation of highly vibrationally excited molecules (e.g., vibrationally excited molecules in a state of a vibrational quantum number more than 5) as precursors of negative ions by collisions (or excitations) of electronegative gas molecules with high-energy electrons with energies of a few tens electron volts (eV), and (2) production of negative ions by dissociative electron attachment to the highly vibrationally excited molecules. For the negative ion production, low-energy electrons (e.g., 1 eV or less) are effective due to intrinsic characteristics of its cross section.

On the other hand, even though the high-energy electrons in the volume production mechanism contribute to the negative ion production by generating the highly vibrationally excited molecules, they are also simultaneously involved in destruction of negative ions (i.e., electron detachment). This is mainly due to the fact that the negative ion production efficiency of the negative ion source based on the volume production mechanism is lower than that based on the surface production mechanism.

Therefore, some researchers have attempted to improve the efficiency of the negative ion source based on the volume production mechanism by introducing plasma pulsing. Here, the plasma pulsing refers to a method of modulating power that sustains the plasma and consequently the electron energy.

However, there is a problem that the negative ion source using the plasma pulsing is unable to continuously supply negative ions since supplying negative ions at high densities by the pulsing is transient and its duration is short (e.g., on the order of microseconds).

Technical Problem

An aspect of the present disclosure is to provide a system for continuously supplying negative ions that meet the needs of those various researches and industrial fields including semiconductor, space propulsion, and fusion fields.

Detailed aspects of the present disclosure are as follows.

A first aspect of the present disclosure is to provide a system capable of generating negative ions using a volume production mechanism and continuously supplying the ions at high densities in order to replace the related art involved in the negative ion source based on a surface production mechanism which is fraught with the maintenance problem and the difficulty of low work function metal surface management.

A second aspect of the present disclosure is to provide a system capable of suppressing destruction of negative ions caused by high-energy electrons, so as to prevent the high-energy electrons generated in plasmas from destroying previously created negative ions.

A third aspect of the present disclosure is to provide a system of continuously supplying negative ions with improved efficiency by integrating the related arts involved in a surface production mechanism or by combining with another technology (e.g., usage of a specific wall material) to increase a volume production reaction rate.

A fourth aspect of the present disclosure is to provide a method of continuously supplying negative ions that satisfy the aforementioned needs.

Technical Solution

In order to achieve the first aspect of the present disclosure, there is provided a system for supplying negative ions using multi-pulsed plasma sources. The system may include a plurality (e.g., two or more) of plasma generators each of which generates plasma by applying pulsed power to electronegative gas supplied from a gas source; a negative ion supply unit connected to each of the plasma generators and configured to receive the plasma transferred from the plasma generators to supply ions; and a controller connected to the plurality of plasma generators and configured to control characteristics of the pulsed powers delivered to the respective plasma generators, and to adjust phase shift between signals associated with pulsed power envelopes. By adjusting the phase shift, the controller may enable a plasma in one of the plasma generators to be in an after-glow when a plasma in another plasma generator is in an active-glow. The plurality of plasma generators may generate the plasmas in an alternating manner depending on the phase shift adjusted by the controller, and may compensate for a decreased amount of the negative ions supply to the negative ion supply unit as a plasma in one plasma generator transitions to the active-glow period by providing an additional supply of negative ions from another plasma generator where the plasma is in the after-glow.

In other words, the system may be configured to increase an amount of the negative ion supply to the negative ion supply unit by switching one plasma generator into the after-glow mode, when another plasma generator is in the active-glow mode leading to a decrease in an amount of the negative ion supply to the negative ion supply unit.

The plurality of plasma generators may be configured such that when one plasma generator supplies precursors of negative ions (i.e., the highly vibrationally excited molecules) and electrons generated in the active-glow to the negative ion supply unit, another plasma generator supplies the negative ions generated in the after-glow to the negative ion supply unit.

The controller may include a plurality of pulse controllers connected to the plasma generators, respectively, and configured to control the characteristics of the pulsed power such that each of plasma generators is in the active-glow or the after-glow mode; and a system controller connected to the pulse controllers and configured to control the phase shift between the pulsed signals associated with the pulse controllers, so as to delay a start time of an active-glow of one plasma generator after an end time of an active-glow of another plasma generator.

In order to achieve the second aspect of the present disclosure, the system for supplying negative ions using multi-pulsed plasma sources may further include a magnetic filter placed between each of the plasma generators and the negative ion supply unit. The magnetic filter may restrict a high-energy electron group, among the electrons created from the plasma generators in the active-glow mode, from entering the negative ion supply unit.

In addition, the magnetic filter may be configured as at least one permanent magnet.

The magnetic filter may be configured as at least one electromagnet, and the electromagnet may produce a magnetic field while linking with operating modes of the plasma generators.

The electromagnet may be interlinked with the signals associated with the pulsed power envelopes so as to produce the magnetic field when the corresponding plasma generator is in the active-glow mode.

The magnetic filter may be provided with a plurality of permanent magnets and electromagnets.

The system may further include more than one plasma particle filter provided between the plasma generators and the negative ion supply unit. The plasma particle filter refers to a device selectively transport particles created in the plasma generators toward the negative ion supply unit.

The plasma particle filter may be provided with an electrode that produces an electric field.

In order to achieve the third aspect of the present disclosure, the system for supplying negative ions using multi-pulsed plasma sources, in which inner surfaces of the plasma generators are coated with a low work function material, may be provided.

In order to achieve the fourth aspect of the present disclosure, there is provided a method for supplying negative ions using multi-pulsed plasma sources. The method may include a step of generating plasmas by applying pulsed powers to a plurality of plasma generators, respectively, and supplying the generated plasmas to a negative ion supply unit, here called a negative ion generation-and-supply step; a step of supplying the negative ions to the negative ion supply unit through an alternating operation of the plasma generators while adjusting phase shift between signals associated with the pulsed powers applied to the respective plasma generators, here called a continuous negative ion supply step; and a step of extracting the negative ions from the negative ion supply unit, here called a negative ion extraction step.

The negative ion generation-and-supply step may include generating plasma containing the negative ions, negative ion precursors, and electrons when the pulsed powers is applied to the respective plasma generators; supplying the negative ion precursors and the electrons to the negative ion supply unit; creating a first negative ion by reactions of the negative ion precursors with the electrons in the negative ion supply unit; creating second negative ions in the plasma generators when power is turned off in the after-glow, by reactions between species produced before power is turned off; and supplying the second negative ions to the negative ion supply unit.

The supplying of the negative ion precursors and the electrons to the negative ion supply unit may include producing a magnetic field by at least one magnetic filter installed between the negative ion supply unit and the plasma generators for the purpose of restricting a high-energy electron group, among the electrons, from entering the negative ion supply unit.

The continuous negative ion supply step may include adjusting phase shift between the signals associated with the pulsed powers applied to the respective plasma generators, so that the plasma generators are supplied with the powers with a predetermined phase lag to one another; and allowing a plasma in one of the plasma generators to be in an after-glow while a plasma in another plasma generator is in an active-glow due to the applied pulsed power, and switching the state of the plasma in each of the plasma generators between the active-glow state and the after-glow state, with the phase shift.

The negative ion extraction step may include configuring a polarity of a beam extraction electrode connected to the negative ion supply unit; and extracting the negative ions from the negative ion supply unit when the beam extraction electrode is positive with respect to the plasma, and extracting positive ions from the negative ion supply unit when the beam extraction electrode is negative.

According to one embodiment disclosed herein, gas supply units (or gas sources) may include gas supply controllers, respectively, configured to control an amount of gases supplied to the plasma generators over time.

According to one embodiment disclosed herein, the system may further include a beam extraction system connected to the negative ion supply unit and configured to extract the negative ions.

Advantageous Effects

The advantageous effects of the present disclosure, achieved through the solutions, will be described as follows.

First, by configuring a plurality of plasma generators to be connected to a negative ion supply unit and by controlling characteristics of pulsed powers delivered to the respective plasma generators and phase shift between signals associated with pulsed power envelopes, an additional supply of negative ions from one plasma generator in an after-glow to the negative ion supply unit can compensate for a decreased amount of negative ion supply from another plasma generator where a plasma transitions to an active-glow period.

This may offer a breakthrough in the long-pending, structural problem of the negative ion source based on both a volume production mechanism and plasma pulsing not being able to continuously supply negative ions.

Second, high-energy electrons are restricted from entering the negative ion supply unit by a magnetic filter installed between the plasma generator and the negative ion supply unit.

The magnetic filter can suppress destruction of negative ions caused by high-energy electrons in the negative ion supply unit, and thus prevent reduction in overall negative ion supply efficiency of the system.

Third, by providing a system and method utilizing the volume production mechanism instead of the surface production mechanism, maintenance of a plasma negative ion source can be facilitated.

Fourth, the proposed system and method can be employed together with the related art involved in the volume production mechanism or the surface production mechanism for improving performance and efficiency of the plasma negative ion source.

Fifth, the negative ion supply method employed in the system can be applicable to various research and industrial fields requiring a supply of negative ions.

BEST MODE FOR CARRYING OUT EMBODIMENTS

Figure 1:
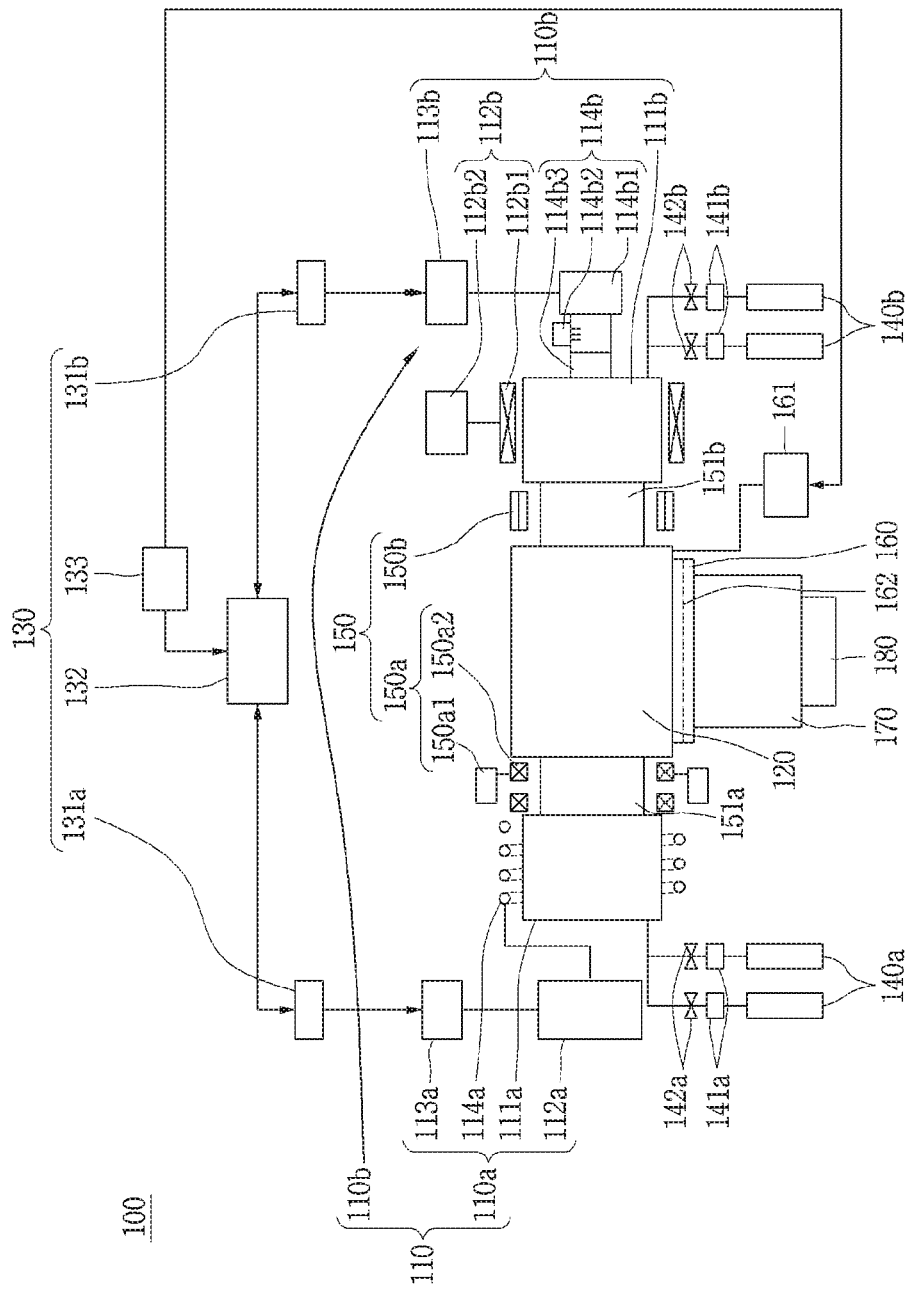
FIG. 1 is a conceptual view of a system of continuously supplying negative ions using multi-pulsed plasma sources.

Systems and methods for continuously supplying negative ions using multi-pulsed plasma sources (hereinafter, referred to as continuous negative ion supply systems based on multi-pulsed plasma sources and continuous negative ion supply methods based on multi-pulsed plasma sources, respectively) in accordance with a few embodiments of the present disclosure will now be described in more detail, which can be understood by reference to the illustrative embodiments depicted in the appended drawings.

As used herein, the singular forms may be intended to include the plural forms as well, unless the context definitely indicates otherwise.

In the following description of exemplary embodiments, moreover, a detailed description of known technologies in the technical fields related to the disclosure will be omitted if it unnecessarily obscures the gist of the present invention.

Reference is made to the accompanying drawings which form a part hereof. Like reference numerals designate like elements throughout the specification, and redundant explanation thereof will be omitted.

The accompanying drawings are for the purpose of easy understanding of the embodiments, but it should be understood that the technical idea of the present disclosure is not limited thereto. It should also be construed that the present disclosure is intended to cover all modifications, equivalents, and alternatives included within the scope of the present disclosure.

In this specification, for convenience of explanation, a description will be given under the assumption that two plasma generators are disposed. In order to indicate the plasma generator, either a reference numeral 110 or reference numerals 110*a* and 110*b* will be chosen as needed. Since this is only for convenience of description, the disclosure is not limited thereto.

For reference, pulsed power to generate a pulsed plasma (hereinafter called pulsed power for brevity) generally includes both a power-on state in which power delivery to the plasma is active and a power-off state in which that to the plasma is inactive. However, in this specification, a state in which pulsed power is applied to the plasma generator is represented as the power-on state in which power delivery to the plasma is active.

Hereinafter, the configuration of a system for continuously supplying negative ions using multi-pulsed plasma sources (or a continuous negative ion supply system based on multi-pulsed plasma sources) will be described first and subsequently a method for continuously supplying negative ions using multi-pulsed plasma sources (or a continuous negative ion supply method based on multi-pulsed plasma sources) will be described in detail.

Figure 2:
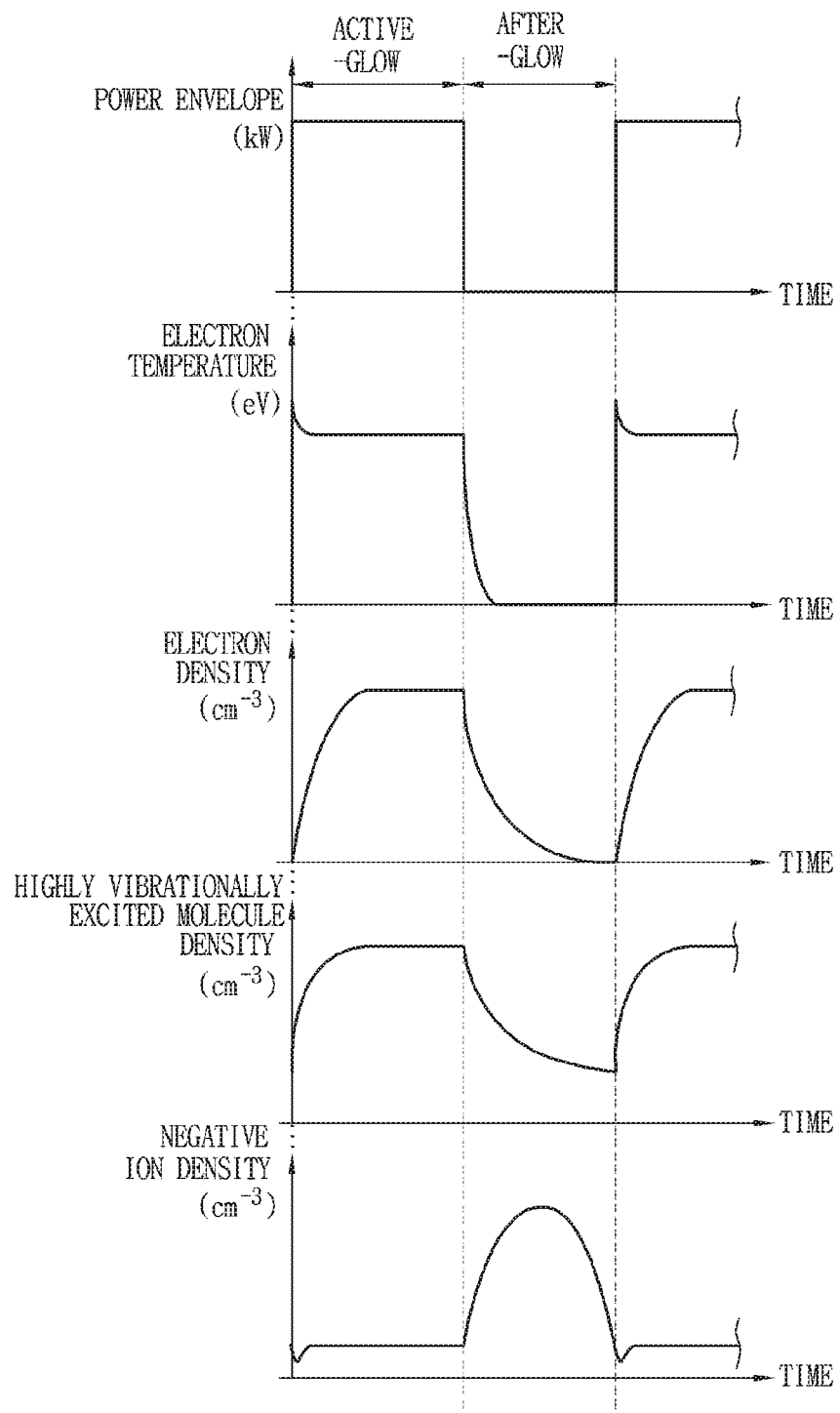
FIG. 2 is a conceptual scheme illustrating plasma characteristics with respect to time when pulsed power is delivered to a single plasma generator.
Figure 3:
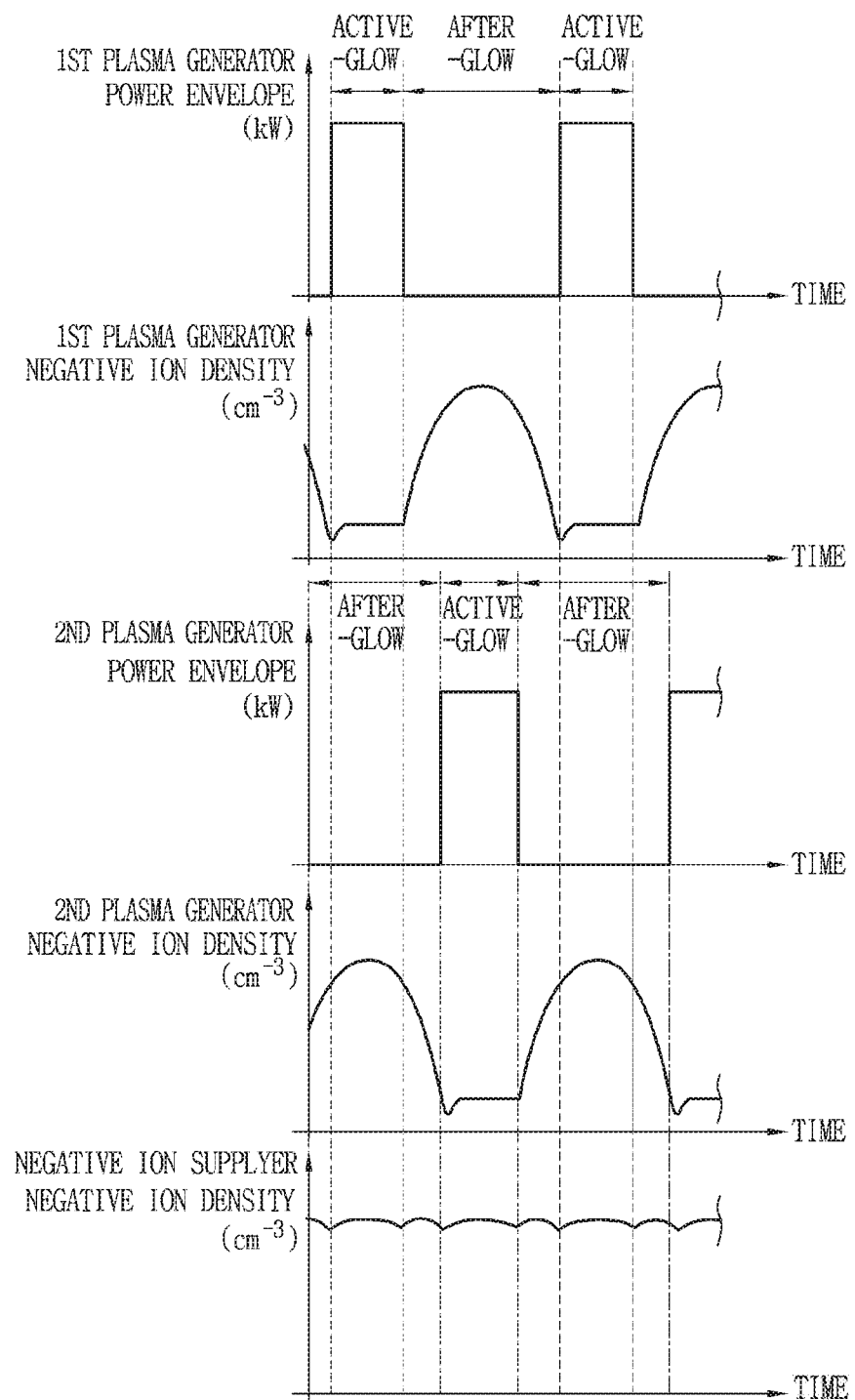
FIG. 3 is a conceptual scheme illustrating plasma characteristics with respect to time when pulsed powers are delivered, in an alternating manner, to a plurality of plasma generators illustrated in FIG. 1.

FIG. 1 is a conceptual view illustrating a continuous negative ion supply system 100 based on multi-pulsed plasma sources according to one embodiment. FIG. 2 is a conceptual scheme illustrating characteristics of a plasma in either of plasma generators 110*a* and 110*b* with respect to time when pulsed power is delivered to the plasma generator 110. FIG. 3 is a conceptual scheme illustrating a continuous negative ion supply step implemented by the continuous negative ion supply system based on multi-pulsed plasma sources 100 through an alternating operation of the plurality of plasma generators 110*a* and 110*b* shown in FIG. 1 with a preset phase shift (phase difference) between signals associated with the pulsed powers applied to the plasma generators, respectively.

The continuous negative ion supply system based on multi-pulsed plasma sources 100 is configured to generate a plasma containing negative ions, highly vibrationally excited molecules as precursors of the negative ions and high- and low-energy electrons by applying pulsed power to input gases including electronegative gas, and to transfer the generated plasma to a negative ion supply unit 120. Here, the highly vibrationally excited molecule generally refers to a vibrationally excited molecule in a state of a vibrational quantum number v more than 5, but is not always limited thereto. The present disclosure may alternatively be applied to a vibrationally excited molecule in a state of the vibrational quantum number v equal to or less than 4.

Each of the plasma generators 110 is configured to generate plasma by applying pulsed power to electronegative gas while adjusting a phase difference between the signals associated with the pulsed powers applied to each of the plasma generators, such that negative ion density in the negative ion supply unit 120 is continuously maintained at a specific value. For reference, a process of transferring the plasma created by the plasma generator 110 to the negative ion supply unit 120 and the transferred species will be described in detail later.

The continuous negative ion supply system based on multi-pulsed plasma sources 100 includes a plasma generator 110, a negative ion supply unit 120 and a controller 130.

The plasma generator 110 includes a plurality of plasma generators 110*a* and 110*b* to generate plasma containing negative ions, their precursors (negative ion precursors), and electrons, and to transfer the generated plasma to the negative ion supply unit 120 connected thereto.

In the drawing, the plurality of plasma generators 110*a* and 110*b* are connected to the negative ion supply unit 120, respectively, and configured to generate plasmas by applying pulsed powers to input gases containing the electronegative gas supplied from gas supply units 140*a* and 140*b* to be described later.

However, although the two plasma generators 110*a* and 110*b* are illustrated in the drawing, the present disclosure is not limited thereto, and the system may be configured without limitation of the number of plasma generators. For reference, the control of the pulsed powers supplied to the respective plasma generators 110*a* and 110*b* will be described later in detail.

One problem which has arisen in the related art is that the negative ion density in a negative ion source using plasma pulsing is time-varying, and thus a continuous supply of negative ions is not achievable. By configuring the system with the plurality of plasma generators 110, the problem can be solved so that continuously supplying the negative ions is possible.

On the other hand, hereinafter, a phenomenon occurring in each plasma generator 110 depending on pulsed power characteristics will be described in detail with reference to FIG. 2.

First of all, for pulsed power, depending upon whether or not power delivery to the plasma generator 110 is active, a period (or state) of a fraction of the cycle for which power is deposited may be referred to as an active-glow, while that for which power is not deposited may be referred to as an after-glow. If occasion arises, the active-glow period and the after-glow period may also be referred to as a power-on state and a power-off state, respectively.

Hereinafter, characteristics of a plasma generated in the plasma generator 110 in each of the active-glow and after-glow states will be described in detail with reference to FIG. 2.

First, temporal variations (μs) of electron temperature (eV), electron density ($cm^{-3}$), highly vibrationally excited molecule density ($cm^{-3}$), and negative ion density ($cm^{-3}$) in the single plasma generator 110 during the active-glow will be described in detail.

In FIG. 2, it can be seen that the electron temperature initially surges and then attains to a steady-state. On the other hand, the electron density increases gradually with increasing power, reaching a constant (or steady-state) value.

In the active-glow state, the highly vibrationally excited molecule density is highly correlated with the electron temperature and the electron density, and thus it tends to increase at the beginning of the active-glow state and subsequently to saturate and remain at a constant value. This is due to the fact that high-energy electrons are involved in generation of the highly vibrationally excited molecules such that the reaction rate for the highly vibrationally excited molecule generation is increased with rises in the electron temperature and the electron density.

Meanwhile, plenty of high-energy electrons in the active-glow contribute to the formation of the highly vibrationally excited molecules at high density but enable the negative ion density in the active-glow to be lower than that in the after-glow to be described later since the high-energy electrons are involved in destruction of the negative ions. Therefore, there is a problem that few negative ions are transferred to the negative ion supply unit 120 in the active-glow state in which power delivery to the plasma is active.

Second, hereinafter, temporal variations of the electron temperature, the electron density, the highly vibrationally excited molecule density, and the negative ion density in the single plasma generator 110 during the after-glow will be described.

In this drawing, it can be seen that the electron temperature decreases dramatically at the beginning of the after-glow state. This is due to the fact that the electrons dissipate their energy in collisions with other particles and by escaping to walls while not being supplied with external energy.

It seems that the decay rate of the electron density is slower than that of the electron temperature. A comparison between the temporal variations of the electron temperature and the electron density reveals that high-energy electrons rather than low-energy electrons are mainly destructed at the beginning of the after-glow.

The highly vibrationally excited molecule density is also reduced due to a decrease in a production rate caused by the loss of the high-energy electrons as reactants and an increase in a destruction rate by collisions (or reactions) of the highly vibrationally excited molecule with other particles and the like. The decay rate of the highly vibrationally excited molecule density is slower than that of the electron temperature.

As a result, for a specific time after the after-glow starts, the densities of the low-energy electrons and the highly vibrationally excited molecules that are reactants in the volume production reaction of the negative ions are high enough for the formation of the negative ions. On the other hand, the densities of the high-energy electrons involved in the destruction reaction of the negative ions becomes very low. Consequently, the negative ion density in the after-glow is higher than that in the active-glow, which is followed by a gradual decrease in the negative ion density by the consumption of the reactants (i.e., the low-energy electrons and the highly vibrationally excited molecules) in the volume production reaction of the negative ions and the like.

Therefore, by taking advantage of the fact that the negative ion density in the after-glow is high and by using the plurality of plasma generators 110, a relatively large amount of negative ions supplied in the after-glow can compensate for a relatively small amount of negative ions supplied in the active-glow.

In other words, the plurality of plasma generators 110 is connected to the negative ion supply unit 120. With the configuration, when one plasma generator 110 in the active-glow state supplies a relatively small amount of negative ions to the negative ion supply unit 120, a state of a plasma in another plasma generator 110 can be switched to the after-glow state in order to compensate for the amount of negative ions supplied. Accordingly, the total amount of negative ions supplied from the plurality of plasma generators 110 to the negative ion supply unit 120 can be kept constant. A detailed description of the configuration and control thereof will be given later.

Meanwhile, the plasma generator 110 may include an Inductively Coupled Plasma (ICP) source, an Electron Cyclotron Resonance (ECR) plasma source, a microwave plasma source, a filament driven arc discharge plasma source, a radio frequency plasma source, a helicon plasma source, a Capacitively Coupled Plasma (CCP) source, and the like, and may be configured by various combinations of those sources.

In one embodiment illustrated in the drawing, the plasma generator 110 is configured by two plasma generators including the ICP source as a first plasma generator 110a and the ECR plasma source as a second plasma generator 110b, and each of the plasma generators 110a and 110b is connected to the negative ion supply unit 120.

The first plasma generator 110a, the ICP source, includes a plasma vessel 111a, an antenna 114a to supply pulsed power to electronegative gas, a continuous wave power supply 113a to apply power to the antenna 114a, and an impedance matching network 112a.

The second plasma generator 110b, the ECR plasma source, includes a plasma vessel 111b, a magnet 112b for producing a magnetic field and also creating an Electron Cyclotron Resonance (ECR) zone, a power supply 113b for a microwave generator (e.g., a magnetron and a klystron), and a microwave generation system 114b.

The magnet 112b may include an electromagnet 112b1 and an electromagnet power supply 112b2. The microwave generation system 114b may include a microwave generator 114b1 that generates microwaves, a stub tuner 114b2 for impedance matching, and a waveguide 114b3 for transmitting the microwaves.

However, the plasma generators 110a and 110b are not limited to the above embodiment and may alternatively be configured in various combinations as mentioned above.

The negative ion supply unit 120 is connected with each of the plasma generators 110 to receive and accommodate the negative ions generated in the plasma generator 110 or to provide a region in which negative ions are generated by reactions between negative ion precursors and low-energy electrons received from the plasma generator 110.

For a specific method of transferring the plasma generated by the plasma generator 110 to the negative ion supply unit 120, a method employing diffusion or an electric field formed by applying a voltage to a grid (or an electrode) may be considered. This will be described in detail later.

The negative ion supply unit 120 may be maintained to have a high negative ion density by receiving a large number of negative ions generated in one plasma generator 110 in the after-glow state, and also negative ion precursors and electrons generated in another plasma generator 110 in the active-glow state.

In addition, the plurality of plasma generators 110 operates in an alternating manner with a phase shift (or phase difference) between pulses, so that the negative ion supply unit 120 can contain negative ions while keeping the negative ion density constant (time-independent) over time. This will be described in detail later.

The controller 130 is configured to be connected to each plasma generator 110 and to control characteristics of pulsed power delivered to the plasma generator 110. Here, the characteristics of the pulsed power refer to parameters characterizing the pulse at which the pulsed power is provided from a power supply to the single plasma generator 110, and may include pulse repetition frequency, pulse width, duty cycle and like.

The controller 130 is configured to adjust the phase difference between signals associated with the pulsed powers supplied to the plasma generators 110 so that it enables a plasma in one of the plasma generators 110 to be in the after-glow state when a plasma in another is in the active-glow state.

The controller 130 may be configured to adjust the phase difference between signals associated with the pulsed power envelopes to an optimum value depending on a system configuration and an operating condition, so as to keep the negative ion density in the negative ion supply unit 120 constant over time, resulting in the continuous supply of the negative ions.

The controller 130 includes a plurality of pulse controllers 131a and 131b and a system controller 132.

According to this drawing, the pulse controllers 131a and 131b are configured to be connected to the plasma generators 110a and 110b, respectively, and to adjust the characteristics of the pulsed powers delivered to the respective plasma generators 110a and 110b.

For reference, although this drawing illustrates the two pulse controllers 131a and 131b, the present disclosure is not limited thereto. Of course, the pulse controller may alternatively be employed as many as the plasma generators 110 installed or only one pulse controller may be employed to control the plurality of plasma generators 110.

The pulse controllers 131a and 131b are configured to be connected to the power supplies 113a and 113b of the plasma generators 110a and 110b, respectively, to control the characteristics of the pulsed powers for switching a state of a plasma in each of the plasma generators 110a and 110b between the active-glow state and the after-glow state.

The system controller 132 may be configured to keep the negative ion density constant in the negative ion supply unit 120. To this end, the system controller 132 is configured to be connected to the pulse controllers 131a and 131b to adjust the phase shift between the signals associated with the pulsed power modulated by the pulse controllers 131a and 131b.

The system controller 132 may be configured to adjust the phase shift between the signals associated with the pulse controllers 131a and 131b, so as to delay a start time point of an active-glow of one plasma generator 110 after an end time point of an active-glow of another plasma generator 110.

Referring to FIG. 1, the plasma generator 110a, the ICP source, is referred to as the first plasma generator 110a, and the plasma generator 110b, the ECR plasma source, is referred to as the second plasma generator 110b. However, the present disclosure is not limited to the specified sources, and different types of plasma sources may alternatively be used.

In one embodiment as illustrated in FIG. 3, pulsed powers are applied to the first plasma generator 110a and the second plasma generator 110b with a predetermined phase shift (or phase lag) so that after the end of the active-glow of the first plasma generator 110a, the active-glow of the second plasma generator 110b starts at a specified time interval.

Specifically, when the negative ions supplied from the first plasma generator 110a to the negative ion supply unit 120 are reduced since the first plasma generator 110a is in the active-glow in which the destruction of the negative ions due to the high-energy electrons occurs, the configuration may be intended to supply more negative ions generated from the second plasma generator 110b to the negative ion supply unit 120 by putting the second plasma generator 110b into the after-glow.

In addition, the first plasma generator 110a and the second plasma generator 110b are configured to generate the plasmas in the alternating manner depending on the phase shift between the signals associated with the pulsed power envelopes in a manner that a decreased number of negative ions in one plasma generator 110 is compensated for by negative ions generated in another plasma generator 110. Hence, it is shown that the negative ion density in the negative ion supply unit 120 is kept constant over time.

Such structure can provide a solution to the problem, which has arisen in the related art, in that the negative ion source utilizing the related art pulsing based on the volume production mechanism is not available for the continuous supply of the negative ions. Specifically, the negative ion density in the negative ion supply unit 120 can remain unchanged over time by adjusting the phase difference between the signals associated with the pulsed powers applied to the plurality of plasma generators 110. Accordingly, the present disclosure can be applied to a device that requires such a continuous supply of negative ions.

However, the present disclosure is not limited thereto. In view of the entire system according to the present disclosure, the active-glow state can continue in a way that the active-glow of one plasma generator 110 starts as soon as the active-glow of another plasma generator 110 ends, by adjusting the phase difference between the signals associated with the pulsed power envelopes.

The system 100 for continuously supplying the negative ions using the multi-pulsed plasma sources may include gas supply units 140a and 140b, a magnetic filter 150, a beam extraction system 160, and a vacuum pump system 180.

The gas supply units 140a and 140b are connected to the plasma generators 110a and 110b, respectively, and serve the plasma generators 110a and 110b with background (or diluent) gases, electronegative gases, or their gaseous mixtures for the purpose of controlling plasma characteristics and processes.

The background gas refers to gas capable of controlling plasma characteristics, reactions during processes or side reactions, and may contain argon or hydrogen.

The electronegative gas refers to feedstock gas or gas capable of producing negative ions, and may contain hydrogen, fluorine or chlorine.

The gas supply units 140a and 140b may further include gas supply controller 141a and 141b, respectively, configured to control an amount of gases supplied to each of the plasma generators 110 over time. The configuration can control the gas supply for that to be changed or unchanged over time, thereby facilitating the control of plasma and process characteristics.

A portion where the gas supply units 140a and 140b are connected to the respective plasma generators 110 may be formed in various shapes, such as a single hole or a round showerhead having multi-apertures, depending on what a user needs.

Each of the gas supply units 140a and 140b may be provided with an evaporator for turning a liquid or solid form of an input substance into a gaseous form, or a gas blender for mixing background gas and feedstock gas (or electronegative gas).

The gas supply units 140a and 140b may further include valves 142a and 142b for isolating and regulating gas flows to the plasma generators 110 or for preventing a backflow of the gases, filters, and temperature controllers (not shown in FIG. 1) for preventing an occurrence of liquefaction of a specific gas.

In this drawing, it is shown that the gas supply units 140a and 140b are configured to supply background gas and electronegative gas separately. However, the present disclosure is not limited thereto, and a single gas supply unit (not shown in the drawing) that can supply blended gas of background gas and electronegative gas may alternatively be provided.

The magnetic filter 150 is placed between the plasma generator 110 and the negative ion supply unit 120 to produce a magnetic field.

The magnetic filter 150 is placed in the vicinity of each of connection portions 151a and 151b linking each of the plasma generators 110 and the negative ion supply unit 120. The magnetic filter 150 may, of course, be positioned toward the plasma generator 110 or the negative ion supply unit 120.

The magnetic filter 150 is configured to produce a magnetic field to restrict high-energy electrons generated in the plasma generator 110 in the active-glow state from entering the negative ion supply unit 120.

The magnetic filter 150 may be configured as a magnetic filter using electromagnets 150a (hereinafter, referred to as an electromagnet magnetic filter 150a) or a magnetic filter using permanent magnets 150b (hereinafter, referred to as a permanent magnet magnetic filter 150b), or may alternatively be provided in various other combinations.

The electromagnet magnetic filter 150a may include a power supply for an electromagnet 150a1 and an electromagnet 150a2.

The electromagnet magnetic filter 150a may operate while being synchronized with a signal associated with a pulsed power envelope by the system controller 132, and may adjust a magnitude of a magnetic field depending on an operating state of the plasma generator 110. Specifically, the magnetic filter 150 generates a magnetic field when the corresponding plasma generator 110 is in the active-glow state, so as to prevent the high-energy electrons from transferring to the negative ion supply unit 120. Of course, the electromagnet magnetic filter 150a may produce a static magnetic field or a time-varying magnetic field, or may operate with a predetermined phase shift with respect to the signal associated with the pulsed power envelope.

Referring to this drawing, the configuration offers two advantages. First, the high-energy electrons are restricted from entering the negative ion supply unit 120 so that only the low-energy electrons and the negative ion precursors generated in the first plasma generator 110a in the active-glow state can be supplied to the negative ion supply unit 120, leading to the generation of the negative ions in there. Second, simultaneously, the destruction of the negative ions, which are supplied from the second plasma generator 110b in the after-glow state to the negative ion supply unit 120, due to the high-energy electrons can be suppressed.

Accordingly, the negative ion density in the negative ion supply unit 120 can remain high, and a fluctuation in the negative ion supply can be reduced.

The permanent magnet magnetic filter 150b has advantages of being simple to be installed and being able to filter out the high-energy electrons at lower cost than the electromagnet magnetic filter 150a.

The configuration allows the destruction of the negative ions caused by the high-energy electrons in the negative ion supply unit 120 to be suppressed, resulting in prevention of reduction in the overall negative ion supply efficiency of the system 100 for continuously supplying the negative ions using the multi-pulsed plasma sources.

Meanwhile, instead of installing the magnetic filter 150, a volume or shape of a plasma vessel in the plasma generator 110 or the negative ion supply unit 120 may be changed so as to decrease the number of the high-energy electrons and diffuse (or transport) other species to the negative ion supply unit 120. For the same purpose, a size or shape of each of the connection portions 151a and 151b between the plasma generator 110 and the negative ion supply unit 120 may as well be changed.

Alternatively, a plasma particle filter (not shown in FIG. 1) including an electrode or a grid capable of producing an electric field may be provided between the plasma generator 110 and the negative ion supply unit 120, in order to control transport characteristics of charged particles that are generated in the plasma generator 110 and transferred to the negative ion supply unit 120. For each species, an amount of the charged particles supplied can be controlled depending on a charge state through the plasma particle filter (not shown in the drawing).

This configuration may offer a similar effect to the magnetic filter 150. In addition, of course, the configuration can be employed together with the magnetic filter 150.

The beam extraction system 160 is configured to be connected to the negative ion supply unit 120 so as to extract negative ions from the negative ion supply unit 120 and use the extracted negative ions in the form of a negative ion beam.

As a modified embodiment of the beam extraction system 160, an apertureless plate type electrode or a single-/multi-aperture grid 162 may be configured to be installed in the beam extraction system 160. By applying a voltage to the electrode/grid 162, extraction/use of positive ions or negative ions from an ion-ion plasma can be achieved. When the beam extraction system 160 includes the single-/multi-aperture grid 162, the beam extraction system 160 may further include a reaction chamber 170 in which an ion beam can be used.

The beam extraction system 160 may include a power supply 161 for applying a voltage to the electrode/grid, and a beam extraction system controller 133 connected to the power supply 161 for controlling voltage characteristics.

Device properties of the power supply 161, such as whether to use a direct-current (DC) or an alternating current/radio frequency (AC/RF) power supply, a voltage amplitude, a polarity of the DC power supply, a grounding option (e.g. negative ground, positive ground, or floating ground), and the like, may be determined depending on user's application.

The beam extraction system controller 133 is configured to be connected to the system controller 132, and to receive commands for the control of time-varying output voltages therefrom. Consequently, the beam extraction system controller 133 may control characteristics (e.g., current, other time-varying properties, etc.) of the negative ions or beams extracted from the beam extraction system 160.

The vacuum pump system 180 may be configured to be connected to the reaction chamber 170, and to enable a time-varying control of gas pressure in conjunction with the gas supply units 140a and 140b. Of course, various configurations can be provided by changing number and connection positions of the vacuum pump system.

By providing the configuration, the present disclosure can offer a system utilizing the volume production mechanism, so as to facilitate maintenance of the plasma generators 110 and the like, compared to the negative ion source based on the surface production mechanism.

In another embodiment, a system (not shown) for continuously supplying negative ions using multi-pulsed plasma sources may be configured to use a specific material capable of generating a large number of highly vibrationally excited molecules at a specific temperature for inner surfaces of the plasma generator 110 and the like in order to improve the negative ion production efficiency. For the same purpose, the system may also be configured by coating the inner surfaces of the plasma generator 110 and the like with a low work function material.

The configuration provides higher negative ion production efficiency and even easier maintenance of the system, compared to the related art plasma negative ion source utilizing only the surface production mechanism.

Hereinafter, a method for continuously supplying negative ions using multi-pulsed plasma sources will be described in detail.

Figure 4:
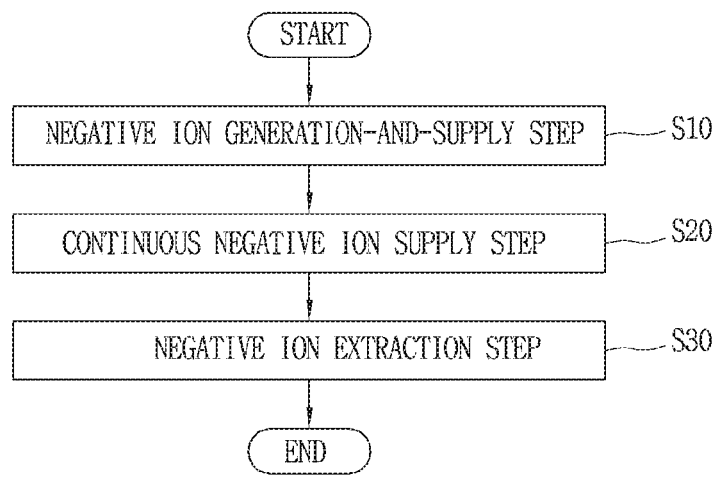
FIG. 4 is a flowchart illustrating a method of continuously supplying negative ions using multi-pulsed plasma sources.

FIG. 4 is a flowchart illustrating a method of continuously supplying negative ions using multi-pulsed plasma sources, in accordance with one embodiment.

Figure 5:
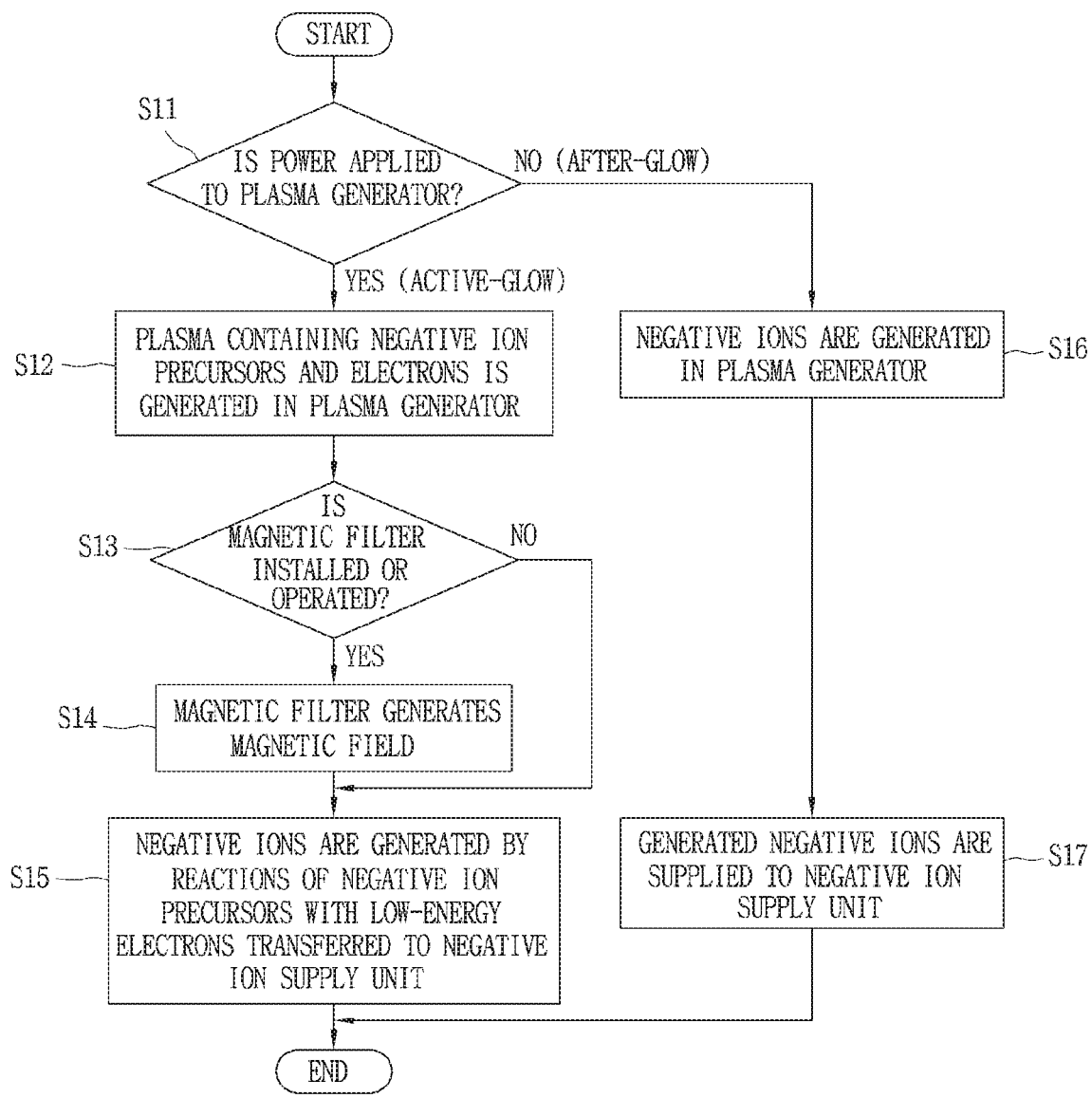
FIG. 5 is a detailed flowchart related to a negative ion generation-and-supply step in the flowchart illustrated in FIG. 4.
Figure 6:
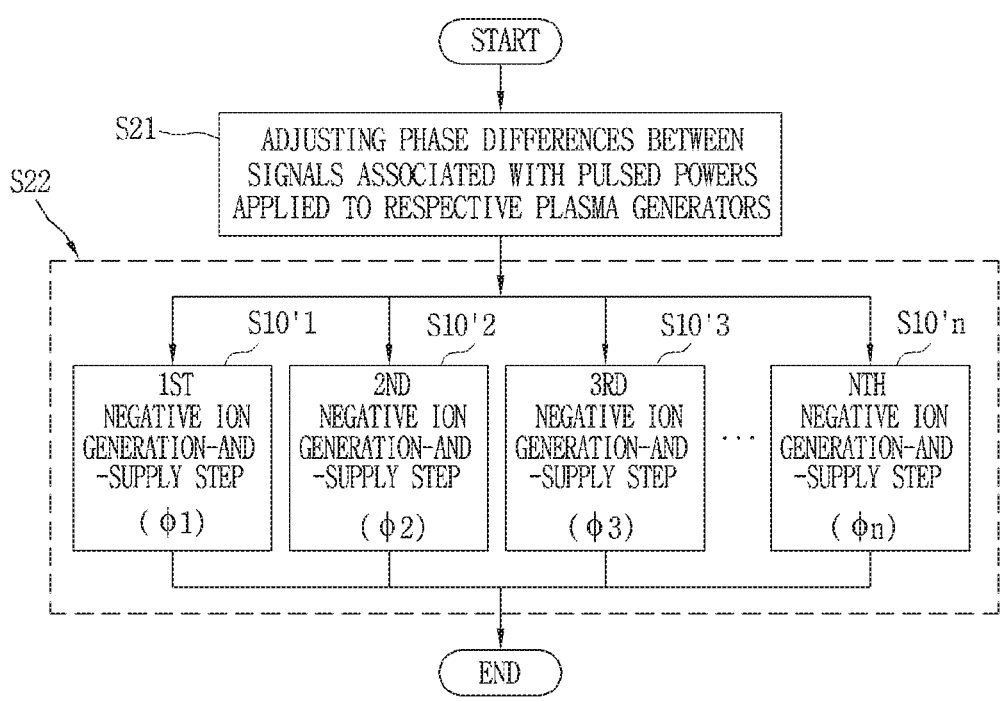
FIG. 6 is a detailed flowchart related to a continuous negative ion supply step in the flowchart illustrated in FIG. 4.
Figure 7:
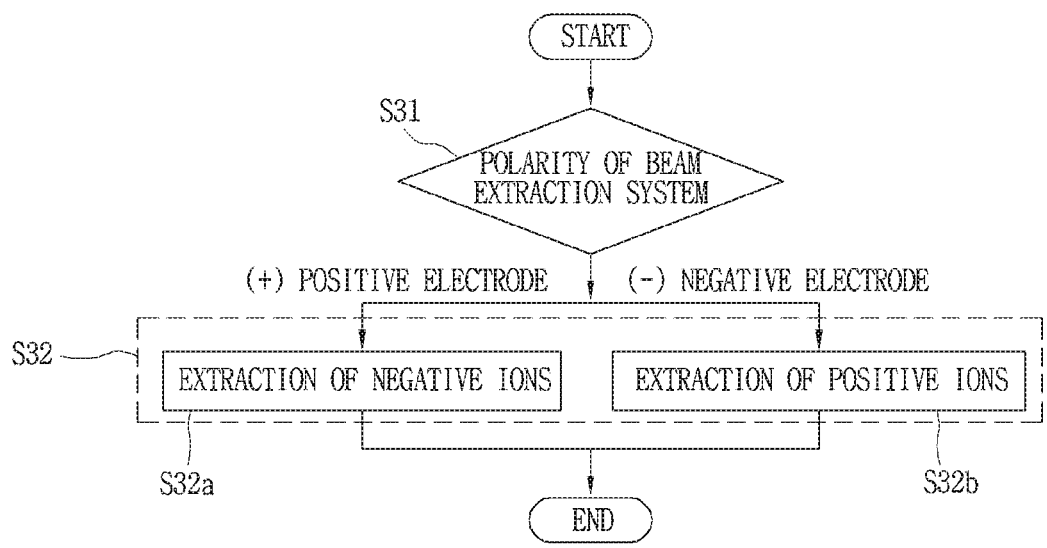
FIG. 7 is a detailed flowchart related to a negative ion extraction step in the flowchart illustrated in FIG. 4.

FIG. 5 is a detailed flowchart related to a negative ion generation-and-supply step among those steps included in the flowchart illustrated in FIG. 4. FIG. 6 is a detailed flowchart related to a continuous negative ion supply step among those steps included in the flowchart illustrated in FIG. 4. FIG. 7 is a detailed flowchart related to a negative ion extraction step as the last step of the flowchart illustrated in FIG. 4.

Figure 8:
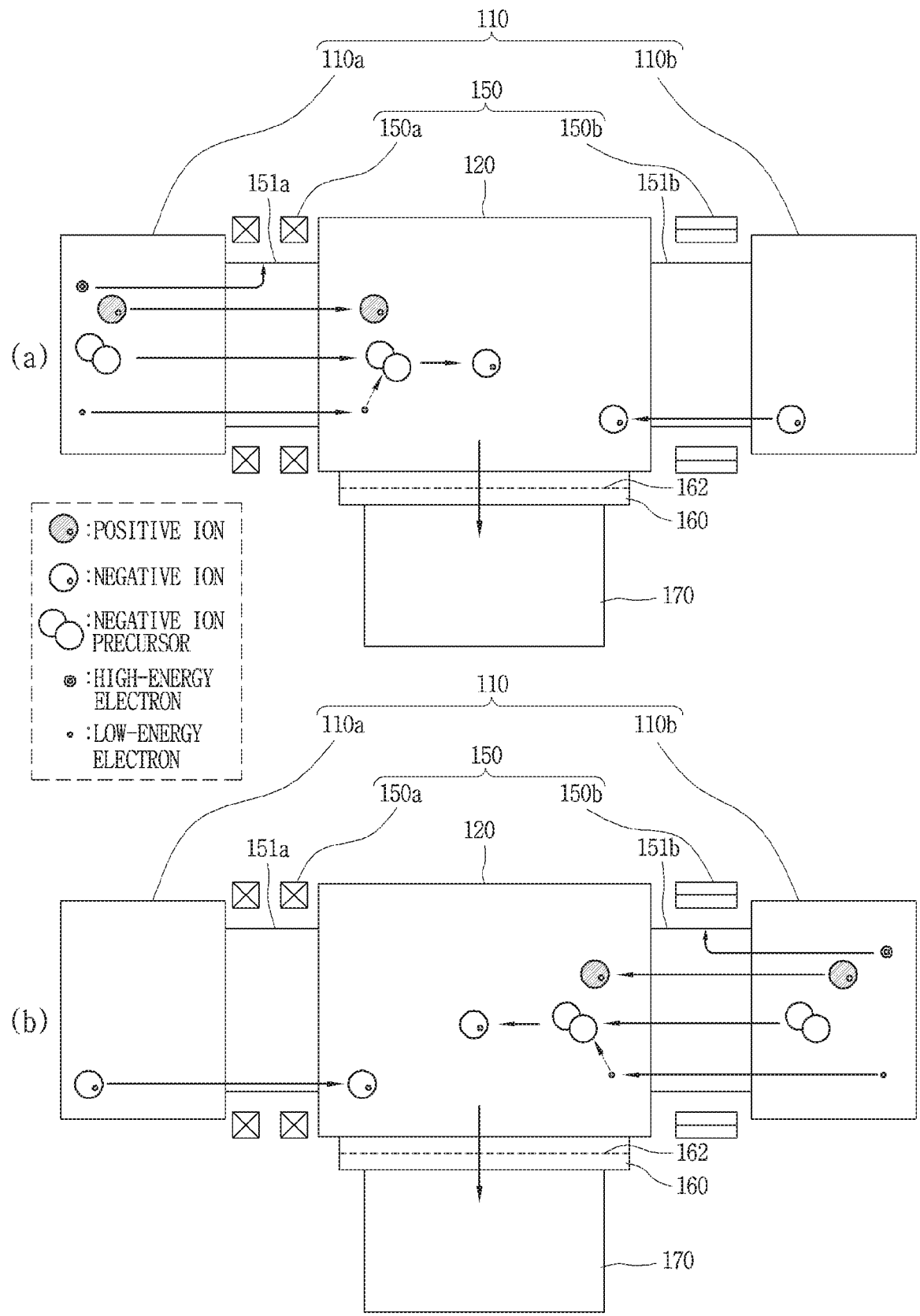
FIG. 8 is a conceptual illustration visualizing the flowchart represented in FIG. 4.

FIG. 8 is a conceptual illustration visualizing the flowchart represented in FIG. 4. Specifically, (a) of FIG. 8 illustrates a state of the plasma and behaviors of plasma species in the case where one plasma generator 110a is in the active-glow state and another plasma generator 110b is in the after-glow state, and (b) of FIG. 8 illustrates those in the case where the one plasma generator 110a is in the after-glow state and the another plasma generator 110b is in the active-glow state.

Referring to FIG. 4 and (a) and (b) of FIG. 8, a method of continuously supplying negative ions using multi-pulsed plasma sources may include a negative ion generation-and-supply step (S10) of supplying negative ions, negative ion precursors and electrons generated in each of the plurality of plasma generators 110a and 110b in the active-glow state to the negative ion supply unit 120, or supplying negative ions generated in that in the after-glow state to the negative ion supply unit 120; a continuous negative ion supply step (S20) of continuously supplying negative ions to the negative ion supply unit 120 through an alternating operation of the plasma generators 110a and 110b while adjusting a phase difference between signals associated with pulsed powers applied to the respective plasma generators 110a and 110b; and a negative ion extraction step (S30) of extracting the negative ions from the negative ion supply unit 120.

For reference, the term "alternating" does not just mean that the active-glow state of one plasma generator 110b starts as soon as the after-glow state of another plasma generator 110a ends at a phase difference of 180 degrees to each other (i.e., out-of-phase), and even includes meaning of that the pulsed powers are applied to the plasma generators 110a and 110b with any phase lag so that after the end of the active-glow of one plasma generator, the active-glow of another plasma generator starts at a specific time interval.

Hereinafter, each step will be described in detail.

Referring to FIGS. 5 and 8, the negative ion generation-and-supply step S10 may be divided into two steps (S12 and S16) depending on whether or not the power is applied to each of the plasma generators 110a and 110b (S11).

In the active-glow state in which the power delivery to the plasma generator 110 is active, the negative ion generation-and-supply step S10 includes generating a plasma that contains large numbers of positive ions, negative ion precursors and electrons and a relatively small number of negative ions (S12), and generating negative ions by reactions between the negative ion precursors and the low-energy electrons transferred from the plasma generator 110 (S15).

In this respect, when the magnetic filter 150 is placed between each of the plasma generators 110a and 110b and the negative ion supply unit 120, if necessary, and the operation of magnetic filter 150 is controlled by the system controller 132, the step of supplying electrons to the negative ion supply unit 120 prior to the step (S15) may further include configuring the magnetic filter 150 to restrict high-energy electrons from entering the negative ion supply unit 120 (S13) and producing the magnetic field by the magnetic filter 150 (S14).

In the after-glow state in which the power delivery to the plasma generator 110 is inactive, the negative ion generation-and-supply step (S10) includes generating negative ions in the plasma generator 110 by reactions of the negative ion precursors with the low-energy electrons in a circumstance where a large number of high-energy electrons is destructed (S16), and supplying the generated negative ions to the negative ion supply unit 120 (S17).

Referring to FIGS. 6 and 8, the continuous negative ion supply step (S20) includes adjusting phase differences between the signals associated with pulsed powers applied to the respective plasma generators 110 through the system controller 132 (S21), and supplying negative ions generated in the after-glow state to the negative ion supply unit 120 through the alternating operation of the plasma generators 110 with the phase differences (S22). Here, positive ions, negative ion precursors and electrons are generated in a plasma generator 110 in the power-on state (S10'1). On the other hand, negative ions are generated in the remainder of plasma generators 110 in the power-off state (S10'2 to S10'n).

Referring to FIG. 6, at the step of generating and supplying negative ions (S22), by adjusting pulse phases $\phi 1$, $\phi 2$, . . . $\phi n$ associated with the respective pulsed powers applied to the plurality of plasma generators 110, the corresponding start times of the active-glows which are favorable for generation of negative ions may be the same or different. Here, the pulse phases $\phi 1$, $\phi 2$, . . . $\phi n$ may be different from one another, or some of the pulse phases may be the same. However, setting all of the phases to the same value is not allowed.

The foregoing embodiment has illustrated that when one plasma generator 110 is in the active-glow state, another plasma generator 110 in the after-glow state generates negative ions, but the present disclosure is not limited to this. Alternatively, when one group having a plurality of plasma generators is in the active-glow state, another group may be in the after-glow state by adjusting the phase differences between the signals associated with the pulsed powers.

For reference, in the foregoing description, n is a natural number and denotes the total number of plasma generators 110 installed in the system for continuously supplying negative ions using the multi-pulsed plasma sources.

Referring to FIGS. 7 and 8, the negative ion extraction step (S30) may include setting the polarity of the beam extraction system 160 connected to the negative ion supply unit 120 (S31), extracting positive or negative ions (S32). Specifically, the positive ions are extracted in the case of a negative electrode in beam extraction system 160 (S32a), and the negative ions are extracted in the case of a positive electrode (S32b).

At the negative ion extraction step (S30), the configuration can not only supply negative ions, but also provide positive ions from the negative ion supply unit 120, if necessary, depending on user's application. Therefore, even though the step of extracting ions is named the negative ion extraction step (S30) in this specification, the function of the configuration at the step is not limited to the name.

The foregoing description is merely illustrative for the embodiments to implement the system or method of continuously supplying the negative ions using the multi-pulsed plasma sources according to the present disclosure, and thus the present disclosure is not limited to the foregoing embodiments. It will be understood by those skilled in the art that various changes in form and details may be made therein without departing from the scope of the invention as defined by the appended claims.

INDUSTRIAL APPLICABILITY

The present disclosure may be implemented and applied in various industrial fields including semiconductor equipment, a space propulsion system, and a fusion reactor system in which a continuous supply of negative ions is needed.

The invention claimed is:

1. A system for supplying negative ions using multi-pulsed plasma sources, the system comprising:
   a plurality of plasma generators each configured to generate plasma by applying pulsed power to electronegative gas;
   a negative ion supply unit connected to each of the plurality of plasma generators to receive the generated plasma therefrom; and
   a controller connected to the plurality of plasma generators and configured to control characteristics of the pulsed powers supplied to the respective plasma generators, and to adjust phase shift between signals associated with pulsed power envelopes such that when one of the plasma generators is in an active-glow state, another plasma generator is switched to an after-glow state,
   wherein the plurality of plasma generators generates the plasmas in an alternating manner depending on the phase shift between the signals associated with pulsed power envelopes in a manner that a decreased amount of negative ion supply from one of the plasma generators in the active-glow state to the negative ion supply unit is compensated for by an additional supply of negative ions supplied from another plasma generator in the after-glow state to the negative ion supply unit.

2. The system of claim 1, wherein the plurality of plasma generators is configured such that, when one of the plasma generators supplies negative ion precursors and electrons generated in the active-glow state to the negative ion supply unit, another plasma generator supplies negative ions generated in the after-glow state to the negative ion supply unit.

3. The system of claim 1, wherein the controller comprises a plurality of pulse controllers and a system controller, wherein:
   the plurality of pulse controllers connected to the plasma generators, respectively, and configured to control the characteristics of the pulsed powers for switching the state of the plasma in each of the plasma generators between the active-glow state and the after-glow state; and
   the system controller connected to the pulse controllers, and configured to adjust the phase shift between the signals associated with the pulsed power envelopes modulated by the pulse controllers, so as to delay a start time of the active-glow state of one of the plasma generators after an end time of the active-glow state of another plasma generator.

4. The system of claim 1, further comprising a magnetic filter placed between each of the plasma generators and the negative ion supply unit,
   wherein the magnetic filter restricts high-energy electrons, among the electrons generated from the plasma generators in the active-glow state, from entering the negative ion supply unit.

5. The system of claim 4, wherein the magnetic filter comprises at least one permanent magnet.

6. The system of claim 4, wherein the magnetic filter comprises at least one electromagnet, and
   the electromagnet generates a magnetic field depending on an operating state of the plasma generator.

7. The system of claim 6, wherein the electromagnet is interlinked with the signal associated with the pulsed power envelope so as to produce the magnetic field when the corresponding plasma generator is in the active-glow state.

8. The system of claim 1, further comprising a plasma particle filter provided between the plasma generators and the negative ion supply unit,
   wherein the plasma particle filter selectively transports particles generated in the plasma generators toward the negative ion supply unit depending on charge states thereof.

9. The system of claim 8, wherein the plasma particle filter is provided with either of an electrode and a grid that produce an electric field.

10. The system of claim 1, further comprising gas supply units connected to the plasma generators, respectively, and configured to supply the plasma generators with the electronegative gas.

11. The system of claim 10, wherein the gas supply units comprise gas supply controllers, respectively, configured to control an amount of gas supplied to the plasma generators over time.

12. The system of claim 1, further comprising a beam extraction system connected to the negative ion supply unit and configured to extract the negative ions.

13. A method for supplying negative ions using multi-pulsed plasma sources, the method comprising:
  a negative ion generation-and-supply step of generating plasmas by applying pulsed powers to a plurality of plasma generators, respectively, and supplying the generated plasmas to a negative ion supply unit;
  a continuous negative ion supply step of supplying the negative ions to the negative ion supply unit through an alternating operation of the plasma generators by adjusting phase shift between signals associated with pulsed power envelopes applied to the plurality of plasma generators, respectively; and
  a negative ion extraction step of extracting the negative ions from the negative ion supply unit.

14. The method of claim 13, wherein the negative ion generation-and-supply step comprises:
  generating plasma containing the negative ions, negative ion precursors, and electrons when the plasma generator is in the power-on state;
  supplying the negative ion precursors and the electrons to the negative ion supply unit;
  generating first negative ions by reactions of the negative ion precursors with the electrons in the negative ion supply unit;
  generating second negative ions in the plasma generator when power is turned off, by reactions between plasma species generated before the power is turned off; and
  supplying the second negative ions to the negative ion supply unit.

15. The method of claim 14, wherein the supplying of the negative ion precursors and the electrons to the negative ion supply unit comprises
  producing a magnetic field by a magnetic filter installed between the negative ion supply unit and the plasma generator, in order to restrict high-energy electrons of the electrons from entering the negative ion supply unit.

16. The method of claim 13, wherein the continuous negative ion supply step comprises:
  adjusting the phase shift between the signals associated with the pulsed power envelopes applied to the plurality of plasma generators, respectively, so that the plasma generators are supplied with the pulsed powers with a predetermined phase lag to one another; and
  allowing a plasma in one of the plasma generators to be in an after-glow state while a plasma in another plasma generator is in an active-glow state due to the applied pulsed power, and alternating the state of the plasma in each of the plurality of plasma generators between the active-glow state and the after-glow state, with the phase shift.

17. The method of claim 13, wherein the negative ion extraction step comprises:
  configuring a polarity of a beam extraction electrode connected to the negative ion supply unit; and
  extracting the negative ions from the negative ion supply unit when the beam extraction electrode is positive, and extracting positive ions from the negative ion supply unit when the beam extraction electrode is negative.

* * * * *